United States Patent
Liu et al.

(10) Patent No.: US 10,971,517 B2
(45) Date of Patent: Apr. 6, 2021

(54) SOURCE CONTACT STRUCTURE OF THREE-DIMENSIONAL MEMORY DEVICES AND FABRICATION METHODS THEREOF

(71) Applicant: YANGTZE MEMORY TECHNOLOGIES CO., LTD., Wuhan (CN)

(72) Inventors: Yi Hua Liu, Wuhan (CN); Jun Liu, Wuhan (CN); Lu Ming Fan, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 137 days.

(21) Appl. No.: 16/297,520

(22) Filed: Mar. 8, 2019

(65) Prior Publication Data
US 2020/0235121 A1 Jul. 23, 2020

Related U.S. Application Data

(63) Continuation of application No. PCT/CN2019/072365, filed on Jan. 18, 2019.

(51) Int. Cl.
*H01L 29/76* (2006.01)
*H01L 27/11582* (2017.01)
(Continued)

(52) U.S. Cl.
CPC .... *H01L 27/11582* (2013.01); *H01L 21/0262* (2013.01); *H01L 21/02532* (2013.01);
(Continued)

(58) Field of Classification Search
CPC ......... H01L 21/11582; H01L 21/02532; H01L 21/02595; H01L 21/0262; H01L 21/02164;
(Continued)

(56) References Cited

U.S. PATENT DOCUMENTS 9,018,047 B2 4/2015 Lue
10,147,732 B1 12/2018 Hu et al.
(Continued)

FOREIGN PATENT DOCUMENTS

CN 107863351 A 3/2018
CN 107968091 A 4/2018
(Continued)

OTHER PUBLICATIONS

International Search Report issued in corresponding International Application No. PCT/CN2019/072365, dated Oct. 16, 2019, 4 pages.
(Continued)

*Primary Examiner* — Calvin Y Choi
(74) *Attorney, Agent, or Firm* — Bayes PLLC

(57) ABSTRACT

Embodiments of three-dimensional (3D) memory devices having source contact structure in a memory stack are disclosed. The 3D memory device has a memory stack that includes a plurality of interleaved conductor layers and insulating layers extending over a substrate, a plurality of channel structures each extending vertically through the memory stack into the substrate, and a source contact structure extending vertically through the memory stack and extending laterally to separate the memory stack into a first portion and a second portion. The source contact structure may include a plurality of source contacts each electrically coupled to a common source of the plurality of channel structures.

20 Claims, 8 Drawing Sheets

(51) Int. Cl.
*H01L 29/10* (2006.01)
*H01L 29/417* (2006.01)
*H01L 29/45* (2006.01)
*H01L 21/02* (2006.01)
*H01L 29/40* (2006.01)
*H01L 27/11556* (2017.01)
*H01L 21/311* (2006.01)

(52) U.S. Cl.
CPC .. *H01L 21/02595* (2013.01); *H01L 27/11556* (2013.01); *H01L 29/1037* (2013.01); *H01L 29/401* (2013.01); *H01L 29/41741* (2013.01); *H01L 29/456* (2013.01); *H01L 21/0228* (2013.01); *H01L 21/02164* (2013.01); *H01L 21/02178* (2013.01); *H01L 21/02271* (2013.01); *H01L 21/31116* (2013.01)

(58) Field of Classification Search
CPC ......... H01L 21/02178; H01L 21/02271; H01L 21/0228; H01L 21/31116; H01L 27/11556; H01L 29/1037; H01L 29/401; H01L 29/41741; H01L 29/456; H01L 27/11524; H01L 27/11529; H01L 27/11551–11556; H01L 27/11578–11582; H01L 27/11514; H01L 27/11597
USPC .......................................................... 257/314
See application file for complete search history.

(56) References Cited

U.S. PATENT DOCUMENTS

| | | | |
|---|---|---|---|
| 2009/0309152 A1* | 12/2009 | Knoefler | H01L 27/11582 257/324 |
| 2015/0340377 A1 | 11/2015 | Lee | |
| 2016/0307910 A1 | 10/2016 | Son et al. | |
| 2017/0047334 A1 | 2/2017 | Lu et al. | |
| 2017/0148810 A1* | 5/2017 | Kai | H01L 23/535 |
| 2018/0102316 A1 | 4/2018 | Kim | |
| 2018/0240812 A1* | 8/2018 | Barbato | H01L 27/1157 |
| 2018/0261613 A1* | 9/2018 | Ariyoshi | H01L 27/1157 |
| 2018/0294270 A1* | 10/2018 | Lee | H01L 27/1157 |

FOREIGN PATENT DOCUMENTS

| | | |
|---|---|---|
| CN | 107968093 A | 4/2018 |
| CN | 108962896 A | 12/2018 |
| CN | 109075169 A | 12/2018 |
| CN | 109155316 A | 1/2019 |
| KR | 20150116995 A | 10/2015 |

OTHER PUBLICATIONS

Written Opinion of the International Searching Authority issued in corresponding International Application No. PCT/CN2019/072365, dated Oct. 16, 2019, 4 pages.

* cited by examiner ic # SOURCE CONTACT STRUCTURE OF THREE-DIMENSIONAL MEMORY DEVICES AND FABRICATION METHODS THEREOF

CROSS REFERENCE TO RELATED APPLICATION

This application is continuation of International Application No. PCT/CN2019/072365, filed on Jan. 18, 2019, entitled "SOURCE CONTACT STRUCTURE OF THREE-DIMENSIONAL MEMORY DEVICES AND FABRICATION METHODS THEREOF," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and the fabrication methods to fabricate the 3D memory devices are disclosed herein.

In one example, a memory device includes a memory stack that has a plurality of interleaved conductor layers and insulating layers extending over a substrate, a plurality of channel structures each extending vertically through the memory stack into the substrate, and a source contact structure extending vertically through the memory stack and extending laterally to separate the memory stack into a first portion and a second portion. The source contact structure may include a plurality of source contacts each electrically coupled to a common source of the plurality of channel structures.

In another example, a memory device includes a memory stack having a plurality of interleaved conductor layers and insulating layers extending over a substrate, a plurality of channel structures each extending vertically through the memory stack into the substrate, and a source contact structure extending vertically through the memory stack and extending laterally to separate the memory stack into a first portion and a second portion. The source contact structure may include a plurality of source contacts in and being insulated from one another by a dielectric layer, and each one of the plurality of source contacts is electrically coupled to a common source of the plurality of channel structures.

In still another example, a method for forming a memory device includes forming a plurality of channel structures extending vertically through a memory stack into a substrate, and forming a source contact structure extending vertically through the memory stack and extending laterally to separate the memory stack into a first portion and a second portion. Forming the source contact structure may include forming a plurality of source contacts each electrically coupled to a common source of the plurality of channel structures.

In yet another example, a method for forming a memory device includes forming a plurality of channel structures extending vertically through a memory stack into a substrate and forming a source contact structure extending vertically through the memory stack and extending laterally to separate the memory stack into a first portion and a second portion. A formation of the source contact structure may include forming a plurality of source contacts over a source conductor. Each one of the plurality of source contacts may be electrically coupled to a common source of the plurality of channel structures.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 2-5A illustrate cross-sectional views of an exemplary 3D memory device at various stages of a fabrication process, according to some embodiments of the present disclosure.

Figure 1A:
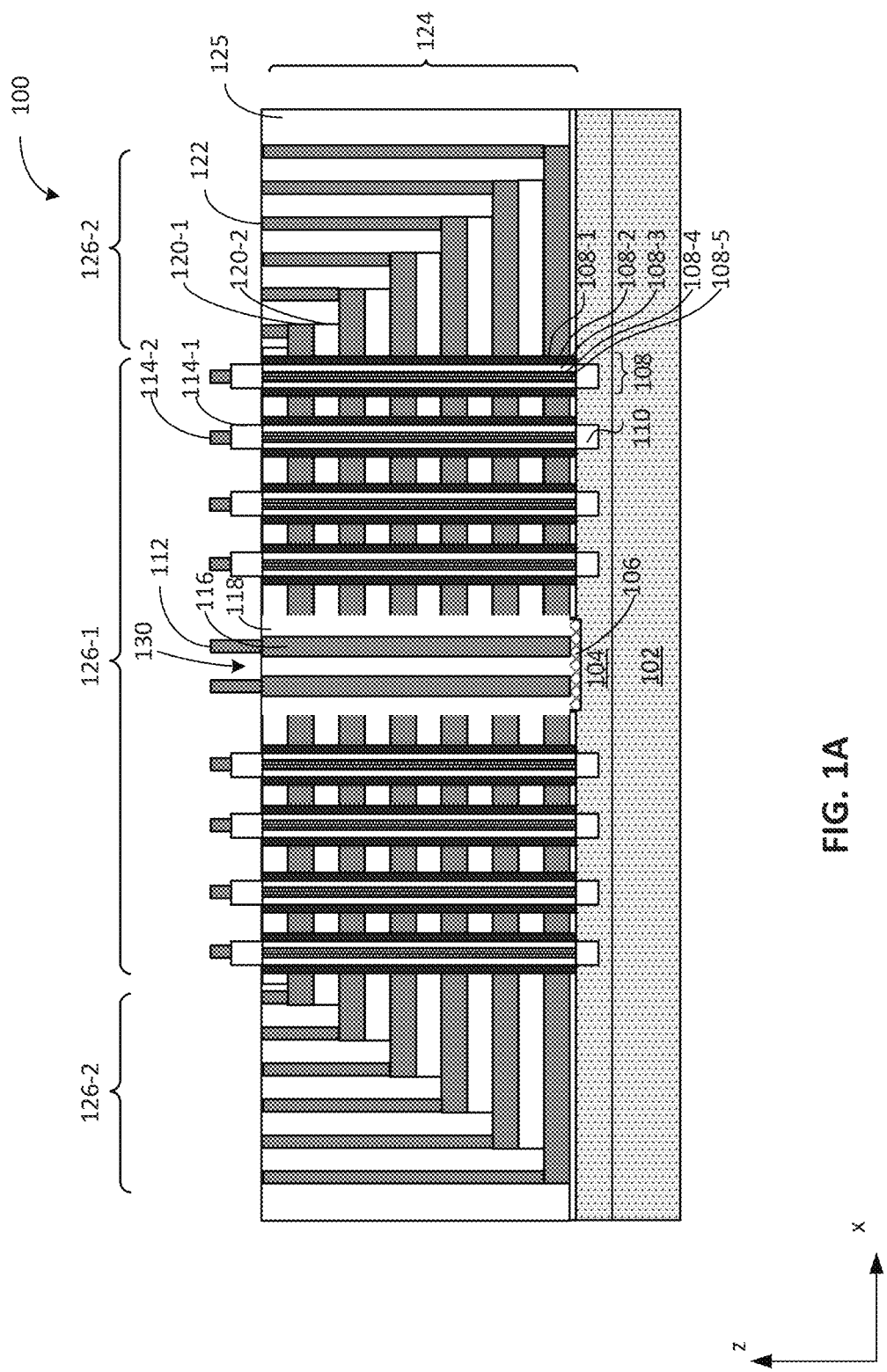
FIG. 1A illustrates a cross-sectional view of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more"

as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

As used herein, the terms "staircase," "step," and "level" can be used interchangeably. As used herein, a staircase structure refers to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "staircase" refers to a vertical shift in the height of a set of adjoined surfaces.

As used herein, the x axis and the y axis (perpendicular to the x-z plane) extend horizontally and form a horizontal plane. The horizontal plane is substantially parallel to the top surface of the substrate. As used herein, the z axis extends vertically, i.e., along a direction perpendicular to the horizontal plane. The terms of "the x axis" and "the y axis" can be interchangeably used with "a lateral direction," "a horizontal direction" or the like, the term of "the x-y plane" can be interchangeably used with "the horizontal plane" or the like, and the term of "the z axis" can be interchangeably used with "the vertical direction" or the like.

In a 3D memory device, data operations such as read, write, and erasure include transmission of data through source and drain electrodes of memory cells. The memory cells, formed by intersections of semiconductor channels and gate electrodes, share a source contact structure (e.g., array common source or "ACS") that is distributed between adjacent semiconductor channels. The source contact structure is often made of one or more conductive materials and vertically extends from a surface of the substrate to be connected to a source line, which is often above the topmost surface of the memory stack(s).

As the demand for higher memory capacity for data storage increases, 3D memory devices employ an increasing number of memory cells arranged vertically to increase memory density. Ways to obtain more memory cells along the vertical direction often include increasing the number of memory cells along the vertical direction in a memory stack. These approaches can cause the source contact structure to have some issues. For example, an increased height of the source contact structure along the vertical direction can result in the conductive materials of the source contact structure (e.g., tungsten) to have increased stress, impairing the material quality of the source contact structure. Also, as an increased amount of conductive materials is used in the source contact structure, some conductive materials (e.g., polysilicon) can result in increased resistance of the source contact structure, affecting device performance. Thus, the source contact structure needs to be improved.

Various embodiments in accordance with the present disclosure provide the structures and fabrication methods of 3D memory devices, which resolve the above-noted issues associated with stress and conductivity of the source contact structure. For example, the source contact structure of the 3D memory device includes a plurality of metal source contacts (e.g., tungsten), each being insulated from one another by a dielectric layer along the vertical direction. The separated source contacts, instead of a one-piece structure, in the dielectric layer can reduce the stress of the metal material. The stress of the dielectric layer can be flexibly controlled and adjusted to maintain low net stress and desired material quality of the source contact structure. Also, a source conductor of sufficiently low resistivity is formed at the bottom of the source contact structure. The source conductor is in contact with the plurality of source contacts and substrate and includes a silicide material. The source conductor electrically couples a common source of the channel structures of the 3D memory device to the source contact structure. In some embodiments, the plurality of source contacts is formed by the same fabrication process that forms the word line contacts in contact with the gate electrodes.

Figure 1B:
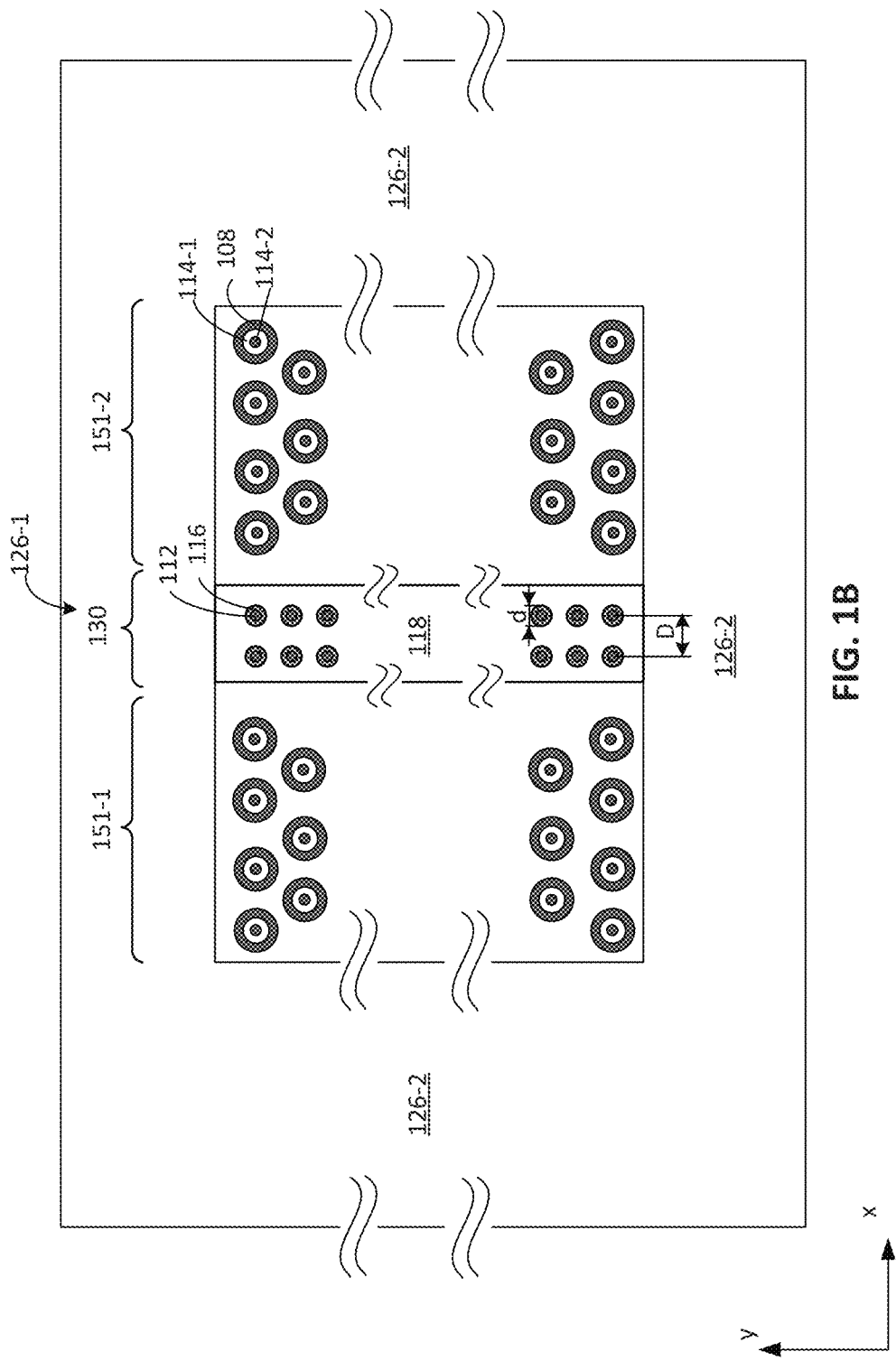
FIG. 1B illustrates a top view of the 3D memory device shown in FIG. 1A, according to some embodiments of the present disclosure.
Figure 3:
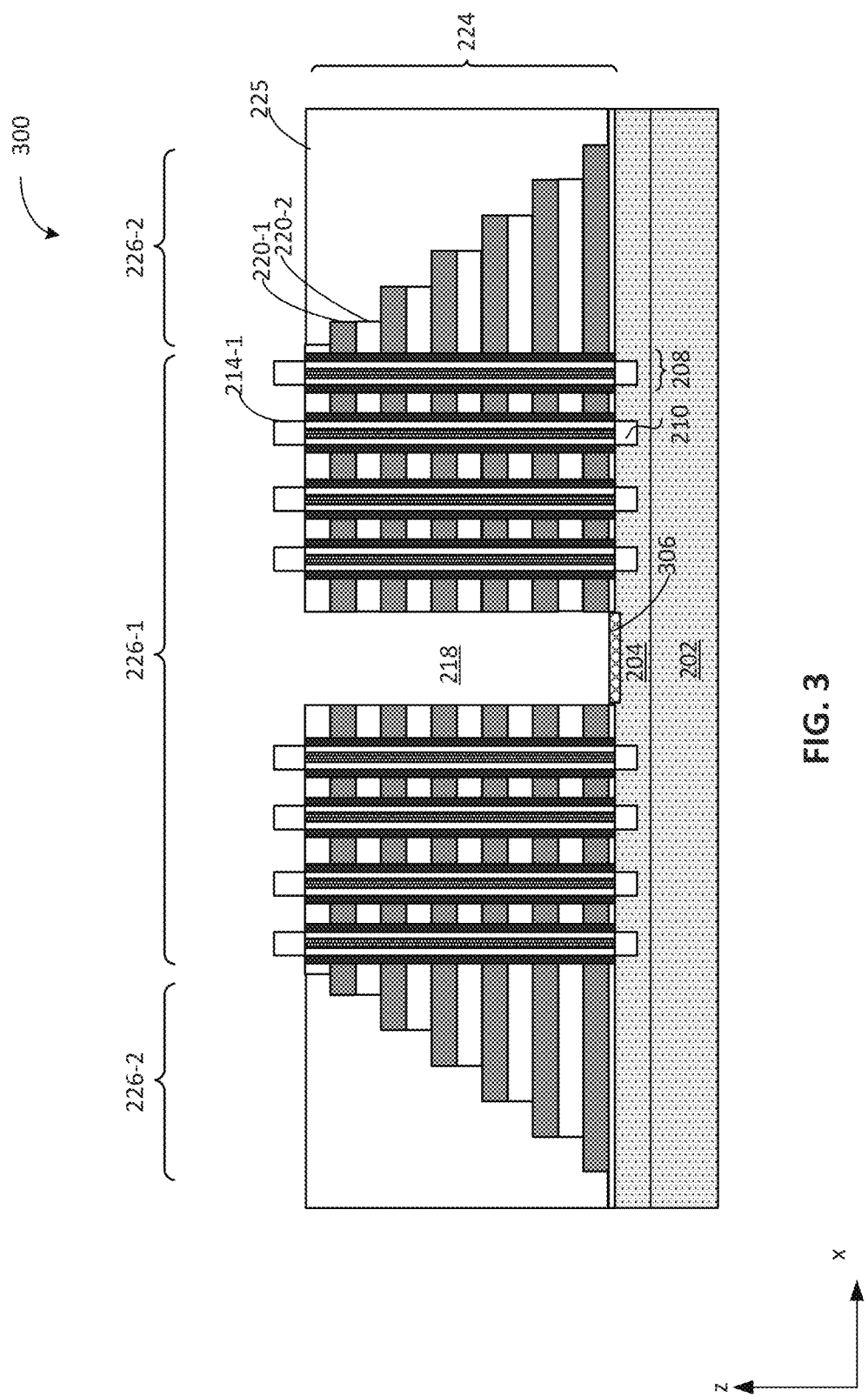
Figure 4:
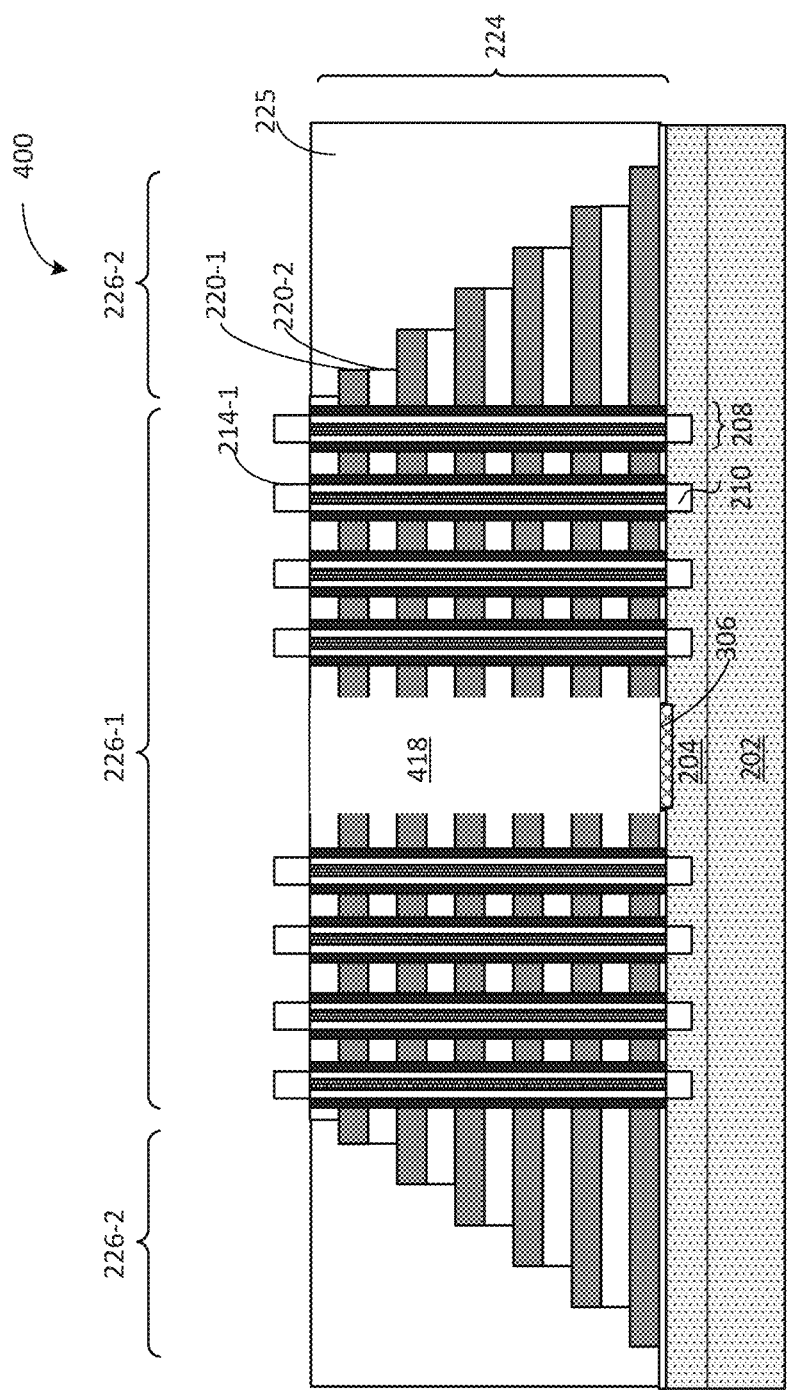
Figure 5A:
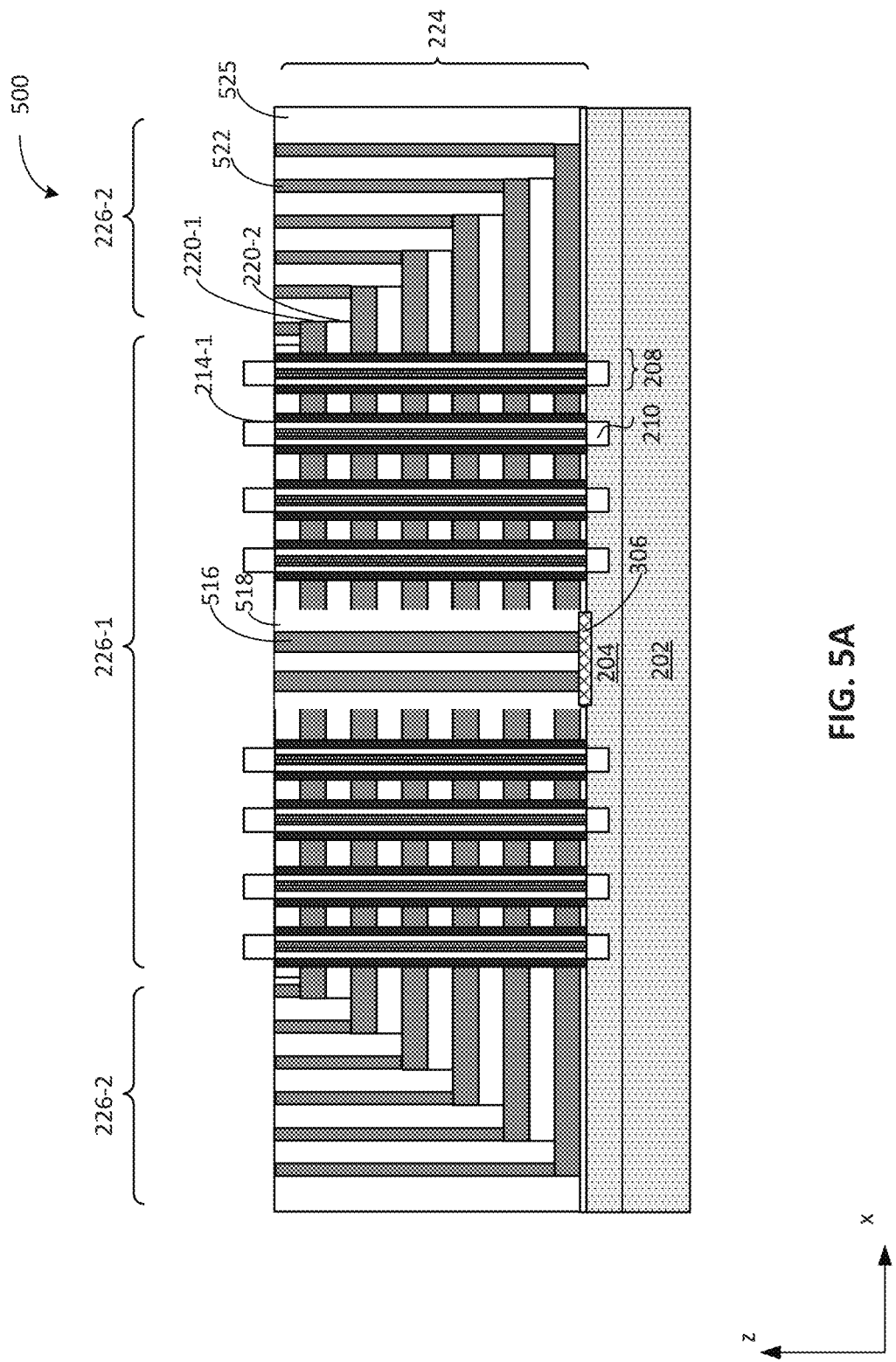
Figure 5B:
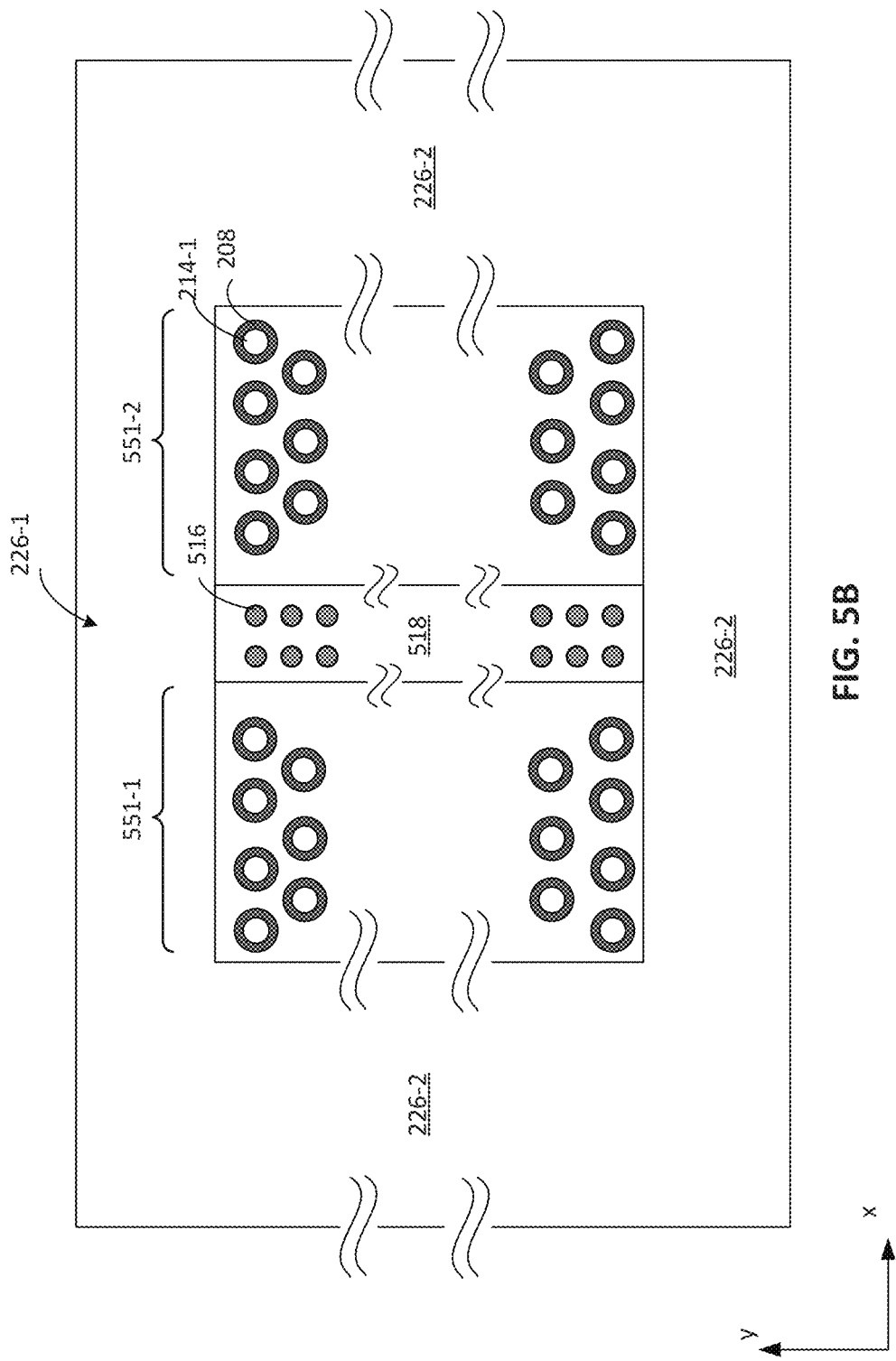
FIG. 5B illustrates a top view of the 3D memory device shown in FIG. 5A, according to some embodiments of the present disclosure.
Figure 6:
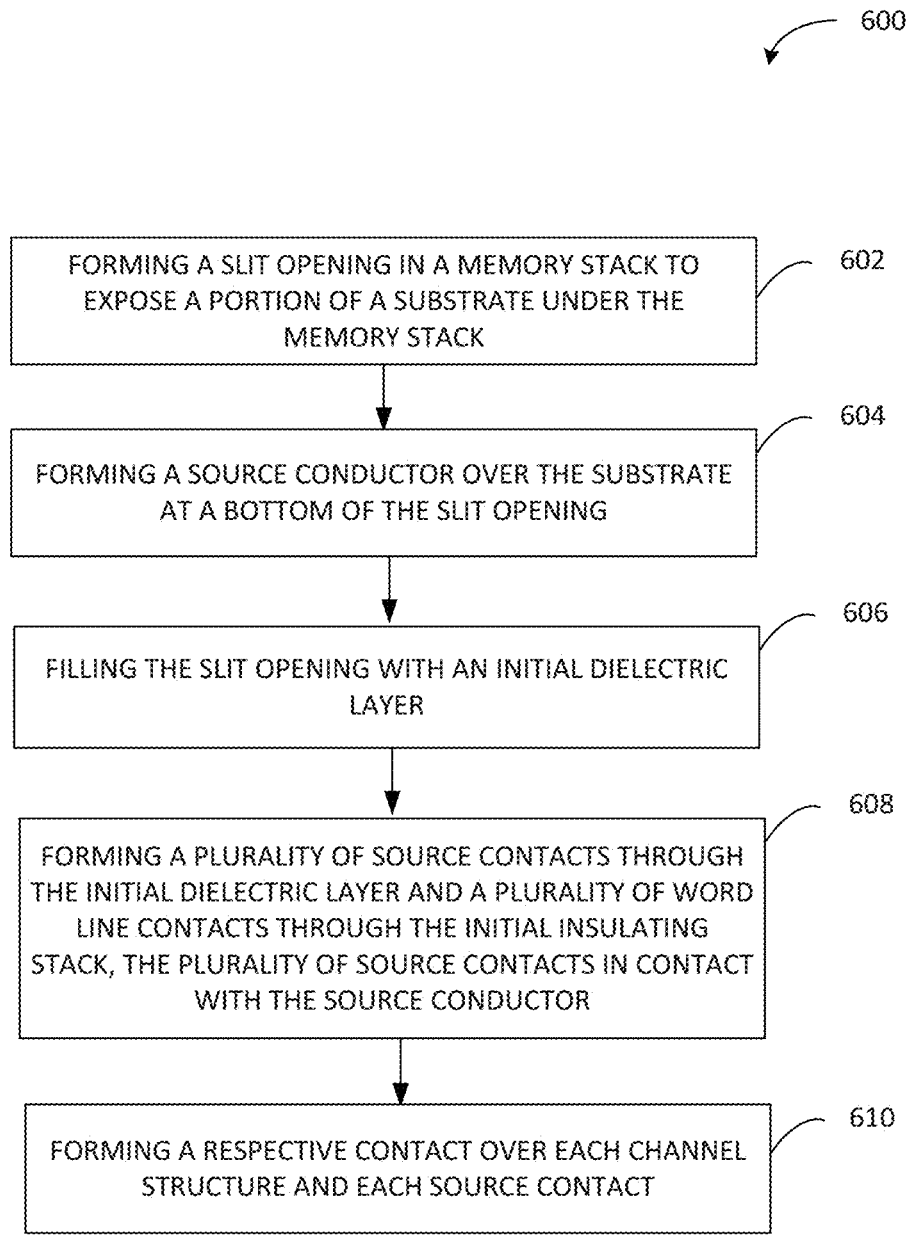
FIG. 6 illustrates an exemplary process flow to form a 3D memory device, according to some embodiments of the present disclosure.

FIG. 1A illustrates a cross-sectional view of a 3D memory device, according to some embodiments. FIG. 1B illustrates a top view of the 3D memory device shown in FIG. 1A. FIGS. 2-5A illustrate cross-sectional views of a 3D memory device at different stages of a fabrication process for forming the 3D memory device shown in FIGS. 1A and 1B, according to some embodiments. FIG. 5B illustrates a top view of the 3D memory device shown in FIG. 5A. FIG. 6 illustrates an exemplary fabrication process 600 to form the 3D memory device shown in FIGS. 1-5B. For ease of illustration, the memory stacks illustrated as examples have one staircase structure. The structures and methods of the present disclosure can also be employed in a same or similar way to form 3D memory devices of multiple stacking staircase structures.

As shown in FIG. 1A, 3D memory device (or "memory structure") 100 may include a memory stack 124 over a substrate 102. Memory stack 124 may include a staircase structure that has a plurality of interleaved conductor layers 120-1 (e.g., gate electrodes) and insulating layers 120-2 stacking along the vertical direction over substrate 102. Memory stack 124 may be in an insulating stack 125 and may include a plurality of channel structures 108 (e.g., semiconductor channels) extending vertically through memory stack 124 into substrate 102. Channel structure 108 may include a blocking layer 108-1, a memory layer 108-2, a tunneling layer 108-3, a semiconductor layer 108-4, and a dielectric core 108-5. Memory device 100 may include a doped semiconductor portion 110 at a bottom of channel structure 108, e.g. in substrate 102. Memory stack 124 may also include a source contact structure 130 that includes a plurality of source contacts 116 in dielectric layer 118. Memory device 100 may also include a source conductor 106 in contact with the plurality of source contacts 116 and substrate. Memory device 100 may further include a first contact 112 over each source contact 116, a second contact 114-1 over each channel structure 108, and a third contact 114-2 over each second contact 114-1. Substrate 102 may further include a doped semiconductor region 104 under memory stack 124 and a plurality of doped semiconductor portions 110 in doped semiconductor region 104. Each doped semiconductor portion 110 may be under a respective channel structure 108. For ease of illustration, memory stack 124 is divided into an array region 126-1 and a staircase region 126-2. Memory cells, formed by intersections of conductor layers 120-1 and channel structures 108, may be formed in array region 126-1. Word line contacts 122 may be formed in staircase region 126-2. Details of each element shown in FIG. 1A are described as follows.

Substrate 102 can include silicon (e.g., single crystalline silicon), silicon germanium (SiGe), gallium arsenide (GaAs), germanium (Ge), silicon on insulator (SOI), and/or any other suitable materials. In some embodiments, substrate 102 includes silicon.

In some embodiments, substrate 102 includes doped semiconductor region 104 (e.g., a well layer). Doped semiconductor region 104 may be located under memory stack 124 (e.g., under channel structures 108 and source contact structure 130). Doped semiconductor region 104 may include an elemental semiconductor material such as single-crystalline silicon, a compound semiconductor material, an organic semiconductor material, and/or other semiconductor materials. For example, doped semiconductor region 104 can include doped singled crystalline silicon formed by a suitable deposition process and/or an ion implantation process.

Memory stack 124 may include a plurality of interleaved conductor layers 120-1 and insulating layers 120-2 stacking over substrate 102 along the vertical direction. Memory stack 124 may have a staircase structure with staircases formed in staircase region 126-2 and memory cells formed in array region 126-1. In some embodiments, each conductor layer 120-1 and a corresponding/underlying insulating layer 120-2 form a staircase. Insulating layers 120-2 may insulate conductor layers 120-1 from one another. Conductor layers 120-1 and insulating layers 120-2 may each have a same thickness (e.g., along the vertical direction) as one another, or have a different thickness than others. Conductor layers 120-1 can include conductive materials including, but not limited to, tungsten (W), cobalt (Co), copper (Cu), aluminum (Al), polycrystalline silicon (polysilicon), doped silicon, silicides, or any combination thereof. Insulating layers 120-2 can include dielectric materials including, but not limited to, silicon oxide (SiO), silicon nitride (SiN), and/or silicon oxynitride (SiON). In some embodiments, conductor layers 120-1 include metals, such as W, and insulating layers 120-2 include SiO.

In some embodiments, memory stack 124 is formed by repetitively etching a dielectric stack of a plurality of interleaved insulating material layers and sacrificial material layers (e.g., a plurality of insulating material layer/sacrificial material layer pairs) stacking vertically over substrate 102 to form a plurality of interleaved insulating layers and sacrificial layers, and replacing the sacrificial layers with a suitable conductive material. The dielectric stack may be formed by, e.g., alternatingly depositing a plurality of insulating material layers and sacrificial material layers, using any suitable deposition processes such as chemical vapor deposition (CVD), physical vapor deposition (PVD), atomic layered deposition (ALD), and/or low-pressure CVD (LPCVD). After the insulating layers and sacrificial layers are formed, the sacrificial layers may be removed, and a desired conductive material may be deposited into the space formed by the removal of the sacrificial layers to form conductor layers 120-1. The sacrificial layers may be removed by any suitable etching processes such as dry etch and/or wet etch. The deposition of conductor layers 120-1 may include any suitable deposition processes such as CVD, PVD, and/or ALD. The number of insulating layer/sacrificial layer pairs in memory stack 124 may be any suitable number such as 32, 64, 96, or 128. The sacrificial layers can include any suitable materials that are different from the material of the insulating layers. In some embodiments, the sacrificial layers include SiN.

In some embodiments, a formation of memory stack 124 can include repetitively etching/trimming an etch mask (e.g., a photoresist layer) over the dielectric stack to expose the portion of insulating material layer/sacrificial material layer pair to be etched, and etching/removing the exposed portion using a suitable etching process. The etching of the etch mask and the insulating material layer/sacrificial material layer pairs can be performed using any suitable etching processes such as wet etch and/or dry etch. In some embodiments, the etching includes dry etch, e.g., inductively coupled plasma etching (ICP) and/or reactive-ion etch (RIE).

Channel structures 108 may each include a blocking layer 108-1, a memory layer 108-2, a tunneling layer 108-3, a semiconductor layer 108-4, and a dielectric core 108-5. Channel structures 108 may be formed by forming channel holes through memory stack 124 to expose substrate 102. A location of each channel hole corresponds to a location of a respective channel structure. Blocking layer 108-1 can reduce or prevent charges from escaping into the subsequently formed gate electrodes. Blocking layer 108-1 can include a single-layered structure or a multiple-layered structure. For example, blocking layer 108-1 can include a first blocking layer and a second blocking layer. The first blocking layer can be formed over the surface of a channel hole by any suitable conformal deposition method. The first blocking layer can include a dielectric material (e.g., a dielectric metal oxide.) For example, the first blocking layer can include a dielectric metal oxide having a sufficiently high dielectric constant (e.g., greater than 7.9.) Examples of the first blocking layer include AlO, hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, and/or alloys thereof. The first blocking layer can be formed by a suitable deposition method such as CVD, ALD, pulsed laser deposition (PLD), and/or liquid source misted chemical deposition. In some embodiments, the first blocking layer includes AlO.

The second blocking layer can be formed over the first blocking layer and can include a dielectric material that is different from the first blocking layer. For example, the second blocking layer can include SiO, SiON, and/or SiN. In some embodiments, the second blocking layer includes SiO, which can be formed by any suitable conformal deposition method such as LPCVD, and/or ALD.

Memory layer 108-2 can include a charge-trapping material and can be formed over blocking layer 108-1. Memory layer 108-2 can include a single-layered structure or a multiple-layered structure. For example, memory layer 108-2 can include conductive materials and/or semiconductor such as tungsten, molybdenum, tantalum, titanium, platinum, ruthenium, alloys thereof, nanoparticles thereof, silicides thereof, and/or polycrystalline or amorphous semiconductor materials (e.g., polysilicon and amorphous silicon). Memory layer 108-2 can also include one or more insulating materials such as SiN and/or SiON. In some embodiments, memory layer 108-2 includes a SiN layer sandwiched by SiON layers, which are further sandwiched by SiN layers. Memory layer 108-2 can be formed by any suitable deposition method such as CVD, ALD, and PVD.

Tunneling layer 108-3 can include a dielectric material through which tunneling can occur under a suitable bias. Tunneling layer 108-3 can be formed over memory layer 108-2 and can include a single-layered structure or a multiple-layered structure and can include SiO, SiN, SiON, dielectric metal oxides, dielectric metal oxynitride, dielectric metal silicates, and/or alloys thereof. Tunneling layer 108-3 can be formed by a suitable deposition method such as CVD, ALD, and/or PVD. In some embodiments, tunneling layer 108-3 includes a plurality of SiON layers and a SiO layer, wherein the plurality of SiON layers is positioned between memory layer 108-2 and the SiO layer.

Semiconductor layer 108-4 can facilitate transport of charges and can be formed over tunneling layer 108-3. Semiconductor layer 108-4 can include one or more semiconductor materials such as a one-element semiconductor material, a III-V compound semiconductor material, a II-VI compound semiconductor material, and/or an organic semiconductor material. Semiconductor layer 108-4 can be formed by any suitable deposition method such as LPCVD, ALD, and/or metal-organic chemical vapor deposition (MOCVD). In some embodiments, semiconductor layer 108-4 includes a poly-silicon layer.

Dielectric core 108-5 can include a suitable dielectric material and can fill up the space in surrounded by semiconductor layer 108-4. In some embodiments, dielectric core 108-5 includes SiO (e.g., SiO of sufficiently high purity) and can be formed by any suitable deposition method such as CVD, LPCVD, ALD, and/or PVD.

Doped semiconductor portion 110 may include a doped semiconductor material formed in substrate 102 (e.g., doped semiconductor region 104) that facilitates the electrical coupling between a common source of channel structures 108 and source contact structure 130. Doped semiconductor portion 110 may include a doped semiconductor material that is formed by an epitaxial growth and/or ion implantation. For example, doped semiconductor portion 110 may include a doped single crystalline silicon formed by epitaxial growth.

Second contacts 114-1 may each be formed over channel structure 108 and third contact 114-2 may each be formed over a respective second contact 114-1. In some embodiments, a dimension (e.g., diameter or width) of second contact 114-1 along the horizontal plane is greater than a dimension of respective third contact 114-2 and smaller than a dimension of respective channel structure 108 so channel structures 108 can be coupled to a respective bit line in a subsequent process. In some embodiments, second contact 114-1 include polysilicon and third contact 114-2 include a metal material such as aluminum, copper, tungsten, and/or cobalt. First contacts 112 may include a suitable conductive material and may each be formed over a respective source contact 116 to facilitate electrical coupling between source contact 116 and a respective source line. In some embodiments, a dimension of first contact 112 along the horizontal plane is smaller than a dimension of source contact 116 along the horizontal plane. In some embodiments, first contact 112 and third contact 114-2 include a same metal material such as tungsten. In some embodiments, first contact 112, second contact 114-1, and third contact 114-2 are each formed by a suitable deposition process such as CVD, PVD, and/or ALD followed by a patterning process (e.g., a photolithography process).

In some embodiments, word line contacts 122 are formed in insulating stack 125 and include a suitable conductive material such as one or more of tungsten, copper, aluminum, cobalt, and polysilicon. Word line contacts 122 may be formed by filling up openings (e.g., exposing a corresponding conductor layer 120-1) in insulating stack 125 with a desired conductive material. In some embodiments, word line contacts 122 are formed by a same fabrication process that forms the plurality of source contacts 116 and may include a same conductive material of the plurality of source contacts 116. Insulating stack 125 may include any suitable dielectric materials such as SiO.

In some embodiments, source contact structure 130 extends vertically through memory stack 124 into substrate 102. Source contact structure 130 may also extend laterally, e.g., along the y direction (e.g., perpendicular to the x-z plane). In some embodiments, source contact structure 130 includes the plurality of source contacts 116 and dielectric layer 118. The plurality of source contacts 116 may be arranged along the directions source contact structure 130 extends. The plurality of source contacts 116 may be positioned in dielectric layer 118 so dielectric layer 118 may insulate each source contact 116 from one another over substrate 102. Source contacts 116 may have any suitable shapes and may be arranged in any suitable pattern. For example, source contacts 116 may be arranged in an array and may each have a pillar shape that has nominally same dimensions. The number of source contacts 116 arranged along the x direction and/or the y direction may be determined based on, e.g., the dimensions of source contact structure 130, the dimensions of source contact 116, and/or design rule requirements. FIG. 1B illustrates a top view of the memory structure shown in FIG. 1A.

As shown in FIG. 1B, source contact structure 130 may extend laterally (e.g., along they axis and parallel to the x-y plane) between a first portion 151-1 and a second portion 151-2 of memory stack 124. Array region 126-1 may be surrounded by staircase region 126-2. For ease of illustration, features in staircase region 126-2 are not shown in FIG. 1B. Channel structure 108 may be positioned in first portion 151-1 and second portion 151-2 of memory stack 124. The plurality of source contacts 116 may be arranged in an array in dielectric layer 118 and may extend vertically through memory stack 124 and laterally in memory stack 124 to separate memory stack 124 into first portion 151-1 and 151-2. For example, the array may include at least one source contact 116 arranged along the x axis and more than one source contacts 116 arranged along the y axis. In some embodiments, a distance D between centers of two adjacent source contacts may range from about 250 nm to about 1.4 µm, such as from 250 nm to 1.4 µm (e.g., 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.1 µm, 1.2 µm, 1.3 µm, 1.4 µm, any range bounded by the lower end by any of these values, or in any range defined by any two of these values) In some embodiments, a dimension (e.g., diameter d) of each source contact 116 may range from about 80 nm to about 150 nm, such as from 80 nm to 150 nm (e.g., 80 nm, 90 nm, 100 nm, 110 nm, 120 nm, 130 nm, 140 nm, 150 nm, any range bounded by the lower end by any of these values, or in any range defined by any two of these values). In some embodiments, diameter d of each source contact 116 is about 120 nm, such as 120 nm. It should be noted that, first portion 151-1 and second portion 151-2 are described herein to merely illustrate the structure and/or positions of source contact structure 130. Other structures, such as other source contact structures 130, may also be formed in first portions 151-1 and second portion 151-2 of memory stack 124, but are omitted herein for simplicity of description.

Source contacts 116 may include any suitable conductive material such as aluminum, tungsten, cobalt, and/or copper. In some embodiments, source contacts 116 include tungsten. Dielectric layer 118 may include any suitable dielectric material that insulates source contacts 116 from one another and from conductor layers 120-1. For example, dielectric layer 118 may include SiO, SiN, and/or SiON. In some embodiments, dielectric layer 118 includes SiO.

The stress of dielectric layer 118 (e.g., made of SiO) may be controlled and/or adjusted to ensure source contact structure 130 to have low net stress and/or source contacts 116 to have low stress. For example, the stress of dielectric layer 118 may be control and/or adjusted by, e.g., controlling the ratio of the total volume of source contacts 116 over a total volume of source contact structure 130, controlling a composition of SiO (e.g., the ratio of a number of silicon atoms over a number of oxygen atoms in a SiO molecule), and/or controlling the formation/deposition condition to form SiO. In some embodiments, a ratio of a total volume of the plurality of source contacts 116 over a total volume of source contact structure 130 ranges from about 30% to about 70%, such as from 30% to 70% (e.g., 30%, 35%, 40%, 45%, 50%, 55%, 60%, 65%, 70%, any range bounded by the lower end by any of these values, or in any range defined by any two of these values).

Referring back to FIG. 1A, in some embodiments, source contact structure 130 also includes a source conductor 106 at a bottom of source contact structure 130. Source conductor 106 may be in contact with the plurality of source contacts 116 and substrate 102. In some embodiments, at least a portion of source conductor 106 is positioned in substrate 102. Source conductor 106 may have sufficiently low resistivity and may facilitate electrical coupling between the common source of channel structures 108 and source contact structure 130 (or source contacts 116). In some embodiments, substrate 102 includes silicon and source conductor 106 includes a silicide layer. For example, source conductor 106 can include one or more of tungsten silicide, titanium silicide, nickel silicide, sodium silicide, platinum silicide, magnesium silicide, and molybdenum silicide. Source conductor 106 may be formed by a self-alignment process. For example, one or more desired metal may be deposited between first portion 151-1 and second portion 151-2 to react with substrate 102 (e.g., silicon) and form silicide. The process to form source conductor 106 may include performing one or more of CVD, PVD, ALD, and sputtering, of a desired metal material over substrate 102 followed by a thermal reaction and/or annealing.

The formation of memory device 100 may be described in view of FIGS. 2-6.

Figure 2:
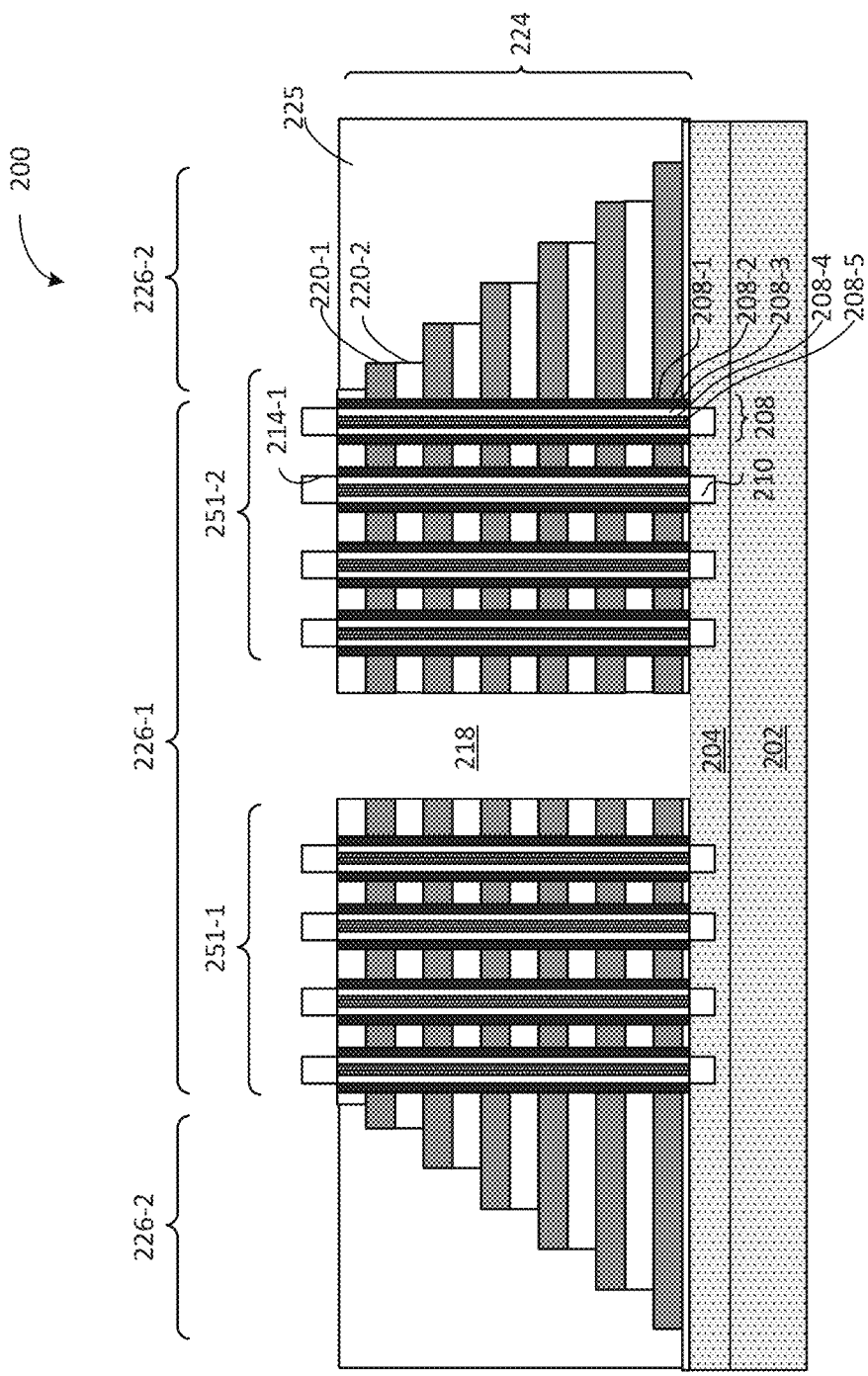

Referring to FIG. 6, at the beginning of the fabrication process, a slit opening is formed in a memory stack to expose a portion of a substrate under the memory stack (Operation 602). FIG. 2 illustrates a cross-sectional view of a corresponding structure 200.

As shown in FIG. 2, a slit opening 218 may be formed in a memory stack 224 to expose a portion of a substrate 202 under memory stack 224. In some embodiments, memory stack 224 includes a staircase structure in an initial insulating stack 225. The staircase structure may include a plurality of interleaved conductor layers 220-1 and insulating layers 220-2 stacking over substrate 202. Memory stack 224 may include a plurality of channel structures 208, each having a blocking layer 208-1, a memory layer 208-2, a tunneling layer 208-3, semiconductor layer 208-4, and dielectric core 208-5. Memory stack 224 may include a plurality of second contacts 214-1 each formed over a respective channel structure 208. Substrate 202 may include a doped semiconductor region 204 under memory stack 224, and a plurality of doped semiconductor portions 210 each under a respective channel structure 208. Initial insulating stack 225 may include a suitable dielectric material such as SiO, SiN, and/or SiON and may be formed by any suitable deposition processes such as CVD, PVD, LPCVD, and/or ALD. In some embodiments, initial insulating stack 225 includes SiO formed by CVD. Memory stack 224 may be divided into an array region 226-1 and a staircase region 226-2. In some embodiments, substrate 202, conductor layers 220-1, insulating layers 220-2, channel structures 208, array region 126-1, staircase region 126-2, first portion 151-1 and second portion 151-2 of memory stack 124, and second contact 214-1 may be the same as or similar to substrate 102, conductor layers 120-1, insulating layers 120-2, channel structures 108, array region 226-1, staircase region 226-2, first portion 251-1 and second portion 251-2 of memory stack 124, and second contact 114-1. Detailed description of these elements may be referred to the description of FIGS. 1A and 1B and is not repeated herein.

Slit opening 218 may be formed between first portion 251-1 and second portion 251-2 of memory stack 224. A pattern and location of slit opening 218 may correspond to a pattern and location of the subsequently-formed source contact structure (e.g., source contact structure 130). Slit opening 218 may extend vertically through memory stack 224 into substrate 202 and laterally to separate memory stack 224 into first portion 251-1 and second portion 251-2. A portion of substrate 202 (or doped semiconductor region 204) may be exposed at a bottom of slit opening 218. In some embodiments, slit opening 218 is a gate line slit of memory stack 224.

Slit opening 218 may be formed by any suitable processes such as forming a patterned etch mask over memory stack 224 to expose a portion of memory stack 224, and etching an exposed portion of memory stack 224 to expose substrate 202 to form slit opening 218. Any suitable etching process may be employed. In some embodiments, a dry etch (e.g., inductively coupled plasma (ICP) etch and/or reactive-ion etch (RIE)) is performed to form slit opening 218.

Referring back to FIG. 6, after the formation of the slit opening, a source conductor is formed over the substrate at the bottom of the slit opening (Operation 604). FIG. 3 illustrates a cross-sectional view of a corresponding structure 300.

As shown in FIG. 3, a source conductor 306 may be formed over substrate 202 at the bottom of slit opening 218. In some embodiments, source conductor 306 includes a self-aligned silicide layer and is similar to or the same as source conductor 106. Detailed description of the structure and formation of source conductor 306 may be referred to the description of FIGS. 1A and 1s not repeated herein.

Referring back to FIG. 6, after the formation of the source conductor, a dielectric material is deposited to fill in slit opening and form an initial dielectric layer (Operation 606). FIG. 4 illustrates a cross-sectional view of a corresponding structure 400.

As shown in FIG. 6, a dielectric material is deposited to fill in slit opening 218 and form an initial dielectric layer 418. Initial dielectric layer 418 may cover source conductor 306. Initial dielectric layer 418 may include a same dielectric material as insulating stack 225 or may include a different dielectric material than insulating stack 225. In some embodiments, initial dielectric layer 418 and insulating stack 225 include the same material, e.g., SiO. Initial dielectric layer 418 may be formed by any suitable deposition process such as CVD, PVD, LPCVD, and/or ALD. Optionally, a planarization process (e.g., chemical mechanical polishing (CMP) and/or recess etch) is performed after the deposition of the dielectric material to remove any excessive dielectric material over initial dielectric layer 418.

Referring back to FIG. 6, after the formation of initial dielectric layer, a plurality of source contacts through the initial dielectric layer and a plurality of word line contacts through the initial insulating stack may be formed, the plurality of source contacts being in contact with the source conductor (Operation 608). FIG. 5A illustrates a cross-sectional view of a corresponding structure 500.

As shown in FIG. 5A, a plurality of source contacts 516 through initial dielectric layer 418 may be formed and a plurality of word line contacts 522 through initial insulating stack 225 may be formed. Dielectric layer 518 and insulating stack 525 may be formed. The plurality of source contacts 516 may be in contact with source conductor 306. In some embodiments, the plurality of source contacts 516 and the plurality of word line contacts 522 are each respectively the same as or similar to the plurality of source contacts 116 and the plurality of word line contacts 122. Detailed description of the plurality of word line contacts 522 and the plurality of source contacts 516 may respectively be referred to the description of the plurality of word line contacts 122 and the plurality of source contacts 116 and is not repeated herein. Similarly, detailed description of dielectric layer 518 and insulating stack 525 may respectively be referred to the description of dielectric layer 118 and insulating stack 125 and is not repeated herein.

In some embodiments, initial dielectric layer 418 and initial insulating stack 225 include the same dielectric material, e.g., SiO, and the plurality of source contacts 516 and the plurality of word line contacts 522 may be formed by a same fabrication process. In some embodiments, a patterned etch mask may be formed over memory stack 224 to expose portions of initial dielectric layer 418 and portions of initial insulating stack 225. A suitable etching process (e.g., dry etch) such as ICP etch and/or RIE may be performed to form openings (e.g., arrays of openings) in initial dielectric layer 418 and initial insulating stack 225 to respectively expose source conductor 306 and conductor layers 220-1. A suitable deposition process such as CVD, PVD, sputtering, and/or ALD may then be performed to deposit a same conductive material into the openings and respective form the plurality of source contacts 516 and the plurality of word line contacts 522. Optionally, a planarization process (e.g., CMP and/or recess etch) may be performed to remove any excessive conductive material over memory stack 224.

In some embodiments, initial dielectric layer 418 and initial insulating stack 225 include different dielectric materials. The patterning of initial dielectric layer 418 and initial insulating stack 225 may be performed separately so the etching of different dielectric materials can be separately controlled for their optimized etching results. The plurality of source contacts 516 and the plurality of word line contacts 522 may also be filled with different conductive materials, e.g., by separate deposition processes. The specific materials and fabrication process to form source contacts 516 and word line contacts 522 should be determined based on different 3D memory devices and/or fabrication requirement and should not be limited by the embodiments of the present disclosure.

FIG. 5B illustrates a top view of structure 500 shown in FIG. 5A. In some embodiments, the plurality of source contacts 516 is arranged in an array in dielectric layer 518 between a first portion 551-1 and a second portion 551-2 of memory stack 224. The plurality of source contacts 516 may extend laterally along the x-y plane. First portion 551-1 and second portion 551-2 of memory stack 224 may respective the same as or similar to first portion 151-1 and second portion 151-2 of memory stack 124. Detailed description of first portion 551-1 and second portion 551-2 of memory stack 224 may be referred to the description of first portion 151-1 and second portion 151-2 of memory stack 124 and is not repeated herein.

Referring back to FIG. 6, after the formation of the plurality of source contacts and the plurality of word line contacts, a respective contact is formed over each channel structure and each source contact (Operation 610). FIGS. 1A and 1B illustrate memory device 100 (e.g., a final structure formed by process 600).

As referring back to FIGS. 1A and 1B, contacts (e.g., first contact 112 and third contact 114-2) may respectively be formed over each source contact 116 (e.g., same as or similar to source contact 516) and each second contact 114-1 (e.g., same as or similar to second contact 214-1). Detailed description of first contact 112 and third contact 114-2 may be referred to the description of FIGS. 1A and 1s not repeated herein.

It should be noted that, in some embodiments, the order to form the channel structures, the conductor layers, and the source contact structure may vary. For example, source contact structure may be formed, e.g., in a dielectric stack, before the formation of channel structures and/or conductor layers. Also, the second contacts over the channel structures may be formed after the formation of source contact structure and before the formation of third contacts. The specific order to form these structures should be determined based on the fabrication processes and should not be limited by the embodiments of the present disclosure.

In some embodiments, a memory device includes a memory stack that has a plurality of interleaved conductor layers and insulating layers extending over a substrate, a plurality of channel structures each extending vertically through the memory stack into the substrate, and a source contact structure extending vertically through the memory stack and extending laterally to separate the memory stack into a first portion and a second portion. The source contact structure may include a plurality of source contacts each electrically coupled to a common source of the plurality of channel structures.

In some embodiments, each of the plurality of source contacts includes at least one of aluminum, tungsten, cobalt, or copper.

In some embodiments, each of the plurality of source contacts includes tungsten.

In some embodiments, the source contact structure further includes a dielectric layer between the first portion and the second portion of the memory stack, and the dielectric layer insulates the plurality of source contacts from the first portion and the second portion of the memory stack.

In some embodiments, the dielectric layer includes at least one of silicon oxide, silicon nitride, or silicon oxynitride.

In some embodiments, the dielectric layer includes silicon oxide.

In some embodiments, the source contact structure further includes a source conductor in contact with the plurality of source contacts and the substrate.

In some embodiments, the substrate includes silicon, and the source conductor includes a silicide layer.

In some embodiments, the plurality of source contacts are arranged in an array over the source conductor.

In some embodiments, a ratio of a total volume of the plurality of source contacts over a total volume of the source contact structure ranges from about 30% to about 70%.

In some embodiments, a distance between centers of two adjacent source contacts ranges from about 250 nm to about 1.4 µm.

In some embodiments, a diameter of each one of the plurality of source contacts ranges from about 80 nm to about 150 nm.

In some embodiments, the diameter of each one of the plurality of source contacts is about 120 nm.

In some embodiments, the memory device further includes a doped semiconductor region in the substrate under the plurality of channel structures and the source conductor, and a doped semiconductor portion under each one of the plurality of channel structures in the doped semiconductor region. The doped semiconductor portion may be electrically coupled to the source conductor via the doped semiconductor region.

In some embodiments, the memory device further includes a first contact over each one of the plurality of source contacts.

In some embodiments, the memory device further includes a second contact over each one of the plurality of channel structures and a third contact over the second contact.

In some embodiments, a memory device includes a memory stack having a plurality of interleaved conductor layers and insulating layers extending over a substrate, a plurality of channel structures each extending vertically through the memory stack into the substrate, and a source contact structure extending vertically through the memory stack and extending laterally to separate the memory stack into a first portion and a second portion. The source contact structure may include a plurality of source contacts in and being insulated from one another by a dielectric layer, and each one of the plurality of source contacts is electrically coupled to a common source of the plurality of channel structures.

In some embodiments, each of the plurality of source contacts includes at least one of aluminum, tungsten, cobalt, or copper.

In some embodiments, each of the plurality of source contacts includes tungsten.

In some embodiments, the dielectric layer includes at least one of silicon oxide, silicon nitride, or silicon oxynitride.

In some embodiments, the dielectric layer includes silicon oxide.

In some embodiments, the source contact structure further includes a source conductor in contact with the plurality of source contacts and the substrate.

In some embodiments, the substrate includes silicon, and the source conductor includes a silicide layer.

In some embodiments, a ratio of a total volume of the plurality of source contacts over a total volume of the source contact structure ranges from about 30% to about 70%.

In some embodiments, a distance between centers of two adjacent source contacts ranges from about 250 nm to about 1.4 µm.

In some embodiments, a diameter of each one of the plurality of source contacts ranges from about 80 nm to about 150 nm.

In some embodiments, the diameter of each one of the plurality of source contacts is about 120 nm.

In some embodiments, the memory device further includes a doped semiconductor region in the substrate under the plurality of channel structures and the source conductor, and a doped semiconductor portion under each one of the plurality of channel structures in the doped semiconductor region. The doped semiconductor portion may be electrically coupled to the source conductor via the doped semiconductor region.

In some embodiments, the memory device further includes a first contact over each one of the plurality of source contacts and a second contact over each one of the plurality of channel structures and a third contact over the second contact.

In some embodiments, a method for forming a memory device includes forming a plurality of channel structures extending vertically through a memory stack into a substrate, and forming a source contact structure extending vertically through the memory stack and extending laterally to separate the memory stack into a first portion and a second portion. Forming the source contact structure may include forming a plurality of source contacts each electrically coupled to a common source of the plurality of channel structures.

In some embodiments, forming the plurality of source contacts includes forming a slit opening extending vertically through the memory stack and extending laterally to separate the memory stack into the first portion and the second portion, and expose the substrate between the first portion and the second portion of the memory stack. Forming the plurality of source contacts may also include filling the slit opening with an initial dielectric layer and forming the plurality of source contacts in the initial dielectric layer between the first portion and the second portion of the memory stack.

In some embodiments, the method further includes forming a source conductor in contact with the plurality of source contacts and the substrate at a bottom of the slit opening between the first portion and the second portion of the memory stack.

In some embodiments, forming the source conductor includes forming a self-aligned silicide layer over the substrate.

In some embodiments, forming the self-aligned silicide layer includes performing one or more of chemical vapor deposition, physical vapor deposition, atomic layered deposition, sputtering, thermal reaction, and annealing to form the self-aligned silicide layer.

In some embodiments, filling the slit opening with the initial dielectric layer includes depositing an insulating material to cover the source conductor and fill up the slit opening and planarizing a top surface of the insulating material.

In some embodiments, depositing the insulating material includes depositing silicon oxide to fill up the slit opening.

In some embodiments, forming the plurality of source contacts in the initial dielectric layer includes forming an array of source contacts over and in contact with the source conductor.

In some embodiments, forming the array of source contacts includes forming an array of openings in the initial dielectric layer to expose the source conductor and depositing a conductive material to fill up the array of openings.

In some embodiments, the method further includes forming an initial insulating stack over the substrate so the memory stack is in the initial insulating stack, forming a plurality of interleaved conductor layers and insulating layers in the memory stack. The plurality of interleaved conductor layers and insulating layers may extend over the substrate. The method may further include forming a plurality of word line contacts and an insulating stack by a same fabrication process that forms the plurality of source contacts. The plurality of word line contacts may extend vertically in the initial insulating stack, the plurality of word line contacts being in contact with the plurality of conductor layers.

In some embodiments, forming the plurality of word line contacts and the insulating stack includes forming a plurality of other openings extending vertically in the initial insulating stack by a same fabrication process that forms the plurality of openings in the initial dielectric layer and filling the plurality of other openings by a same deposition process that fills the plurality of openings in the initial dielectric layer.

In some embodiments, the method further includes forming a first contact over each one of the plurality of source contacts.

In some embodiments, the method further includes forming a second contact over each one of the plurality of channel structures and a third contact over the second contact. A formation of the second contact may include forming a polysilicon portion over each one of the plurality of channel structures. A formation of the third contact may include forming a conductive material by a same fabrication process that forms the first contact.

In some embodiments, the method further includes forming a doped semiconductor region in the substrate. The doped semiconductor region may be under the plurality of channel structures and the plurality of source contacts. The method also includes forming a doped semiconductor portion at a bottom of each one of the plurality of channel structures in the doped semiconductor region so the plurality of channel structures is electrically connected to the plurality of source contacts.

In some embodiments, a method for forming a memory device includes forming a plurality of channel structures extending vertically through a memory stack into a substrate and forming a source contact structure extending vertically through the memory stack and extending laterally to separate the memory stack into a first portion and a second portion. A formation of the source contact structure may include forming a plurality of source contacts over a source conductor. Each one of the plurality of source contacts may be electrically coupled to a common source of the plurality of channel structures.

In some embodiments, a formation of the plurality of source contacts over the source conductor includes forming a slit opening extending vertically through the memory stack and extending laterally to separate the memory stack into the first portion and the second portion and expose the substrate between the first portion and the second portion of the memory stack, and forming the source conductor at a bottom of the slit opening. The source contact may be at least partially in the substrate and being electrically coupled to the plurality of channel structures. The formation also includes filling the slit opening with an initial dielectric layer over the source conductor and forming the plurality of source contacts in the initial dielectric layer in contact with the source conductor between the first portion and the second portion of the memory stack.

In some embodiments, forming the source conductor includes forming a self-aligned silicide layer over the substrate.

In some embodiments, forming the self-aligned silicide layer at the bottom of the slit opening includes performing one or more of chemical vapor deposition, physical vapor deposition, sputtering, thermal reaction, and annealing to form the self-aligned silicide layer.

In some embodiments, filling the slit opening with the initial dielectric layer includes depositing at least one of silicon oxide, silicon nitride, and silicon oxynitride to cover the source conductor and fill up the slit opening, and planarizing a top surface of the at least one of silicon oxide, silicon nitride, and silicon oxynitride.

In some embodiments, forming the plurality of source contacts in the initial dielectric layer includes forming an array of source contacts over and in contact with the source conductor.

In some embodiments, forming the array of source contacts includes forming an array of openings in the initial dielectric layer to expose the source conductor, and depositing a conductive material fill up the array of openings.

In some embodiments, the method further includes forming an initial insulating stack over the substrate so the memory stack is in the insulating stack, and forming a plurality of interleaved conductor layers and insulating layers in the memory stack. The plurality of interleaved conductor layers and insulating layers may extend over the substrate. The method also includes forming a plurality of word line contacts and an insulating stack by a same fabrication process that forms the plurality of source contacts. The plurality of word line contacts may extend vertically in the initial insulating stack, and the plurality of word line contacts may be in contact with the plurality of conductor layers.

In some embodiments, forming the plurality of word line contacts and the insulating stack include forming a plurality of other openings extending vertically in the initial insulating stack by a same fabrication process that forms the plurality of openings in the initial dielectric layer, and filling the plurality of other openings by a same deposition process that fills the plurality of openings in the initial dielectric layer.

In some embodiments, the method further includes forming a first contact over each one of the plurality of source contacts.

In some embodiments, the method further includes forming a second contact over each one of the plurality of channel structures and a third contact over the second contact. A formation of the second contact may include forming a polysilicon portion over each one of the plurality of channel structures. A formation of the third contact includes forming a conductive material by a same fabrication process that forms the first contact.

In some embodiments, the method further includes forming a doped semiconductor region in the substrate, the doped semiconductor region being under the plurality of channel structures and the plurality of source contacts, and forming a doped semiconductor portion at a bottom of each one of the plurality of channel structures in the doped semiconductor region so the plurality of channel structures is electrically connected to the plurality of source contacts.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
 a memory stack comprising a plurality of interleaved conductor layers and insulating layers extending over a substrate;
 a plurality of channel structures each extending vertically through the memory stack into the substrate; and
 a source contact structure extending vertically through the memory stack and extending in a first lateral direction and separating the memory stack into a first portion and a second portion, wherein the source contact structure comprises:
 a dielectric layer between the first portion and the second portion of the memory stack; and
 a plurality of source contacts in the dielectric layer and each electrically coupled to a common source of the plurality of channel structures, the plurality of source contacts comprising more than one source contact in each of the first lateral direction and a second lateral direction perpendicular to the first lateral direction.

2. The memory device of claim 1, wherein each of the plurality of source contacts comprises at least one of aluminum, tungsten, cobalt, or copper.

3. The memory device of claim 2, wherein each of the plurality of source contacts comprises tungsten.

4. The memory device of claim 1, wherein the dielectric layer insulates the plurality of source contacts from the first portion and the second portion of the memory stack.

5. The memory device of claim 4, wherein the dielectric layer comprises at least one of silicon oxide, silicon nitride, or silicon oxynitride.

6. The memory device of claim 5, wherein the dielectric layer comprises silicon oxide.

7. The memory device of claim 1, wherein the source contact structure further comprises a source conductor in direct contact with the plurality of source contacts and the substrate.

8. The memory device of claim 7, wherein the substrate comprises silicon, and the source conductor comprises a silicide layer.

9. The memory device of claim 7, wherein the plurality of source contacts are arranged in an array over the source conductor.

10. The memory device of claim 1, wherein a ratio of a total volume of the plurality of source contacts over a total volume of the source contact structure ranges from about 30% to about 70%.

11. The memory device of claim 1, wherein a distance between centers of two adjacent source contacts ranges from about 250 nm to about 1.4 µm, and a diameter of each one of the plurality of source contacts ranges from about 80 nm to about 150 nm.

12. A memory device, comprising:
    a memory stack comprising a plurality of interleaved conductor layers and insulating layers extending over a substrate;
    a plurality of channel structures in a respective array, the channel structures each extending vertically through the memory stack into the substrate; and
    a source contact structure extending vertically through the memory stack and extending in a first lateral direction and separating the memory stack into a first portion and a second portion, wherein:
        the source contact structure comprises (i) a dielectric layer between the first portion and the second portion of the memory stack, and (ii) a plurality of source contacts in and being insulated from one another by the dielectric layer, the plurality of source contacts arranged in a distribution that comprises more than one source contact in each of the first lateral direction and a second lateral direction perpendicular to the first lateral direction, and
        each one of the plurality of source contacts is electrically coupled to a common source of the plurality of channel structures.

13. The memory device of claim 12, wherein each of the plurality of source contacts comprises at least one of aluminum, tungsten, cobalt, or copper.

14. The memory device of claim 13, wherein each of the plurality of source contacts comprises tungsten.

15. The memory device of claim 12, wherein the dielectric layer comprises silicon oxide.

16. The memory device of claim 12, wherein the source contact structure further comprises a source conductor in direct contact with the plurality of source contacts and the substrate, and the source conductor comprises a silicide layer.

17. The memory device of claim 1, wherein a ratio of a total volume of the plurality of source contacts over a total volume of the source contact structure ranges from about 30% to about 70%, a distance between centers of two adjacent source contacts ranges from about 250 nm to about 1.4 µm.

18. A method for forming a memory device, comprising:
    forming a plurality of channel structures, the channel structures extending vertically through a memory stack into a substrate; and
    forming a source contact structure extending vertically through the memory stack and extending in a first lateral direction to separate the memory stack into a first portion and a second portion, wherein forming the source contact structure comprises:
    forming a dielectric layer in the memory stack; and
    forming in the dielectric layer, a plurality of source contacts in the first lateral direction and a plurality of source contacts in a second lateral direction perpendicular to the first lateral direction, each of the source contacts being electrically coupled to a common source of the plurality of channel structures.

19. The method of claim 18, wherein forming the plurality of source contacts comprises:
    forming a slit opening extending vertically through the memory stack and extending in the first lateral direction to separate the memory stack into the first portion and the second portion and expose the substrate between the first portion and the second portion of the memory stack;
    filling the slit opening with an initial dielectric layer; and
    forming the plurality of source contacts in the initial dielectric layer between the first portion and the second portion of the memory stack.

20. The method of claim 19, further comprising forming a source conductor in direct contact with each of the plurality of source contacts and the substrate at a bottom of the slit opening between the first portion and the second portion of the memory stack, the source conductor comprising a self-aligned silicide layer in direct contact with the substrate.

* * * * *